United States Patent
Stein Von Kamienski (10) Patent No.: US 7,755,130 B2
(45) Date of Patent: Jul. 13, 2010

(54) MINORITY CARRIER SINK FOR A MEMORY CELL ARRAY COMPRISING NONVOLATILE SEMICONDUCTOR MEMORY CELLS

(75) Inventor: Elard Stein Von Kamienski, Dresden (DE)

(73) Assignee: Qimonda AG, Munich (DE)

( * ) Notice: Subject to any disclaimer, the term of this patent is extended or adjusted under 35 U.S.C. 154(b) by 397 days.

(21) Appl. No.: 11/747,037

(22) Filed: May 10, 2007

(65) Prior Publication Data

US 2008/0277717 A1    Nov. 13, 2008

(51) Int. Cl.
*H01L 29/94* (2006.01)
(52) U.S. Cl. .................. 257/314; 257/324; 257/E27.06
(58) Field of Classification Search .................. 257/314, 257/324, E27.06
See application file for complete search history.

(56) References Cited

U.S. PATENT DOCUMENTS

| | | | |
|---|---|---|---|
| H000569 H * | 1/1989 | Varker et al. ................. | 257/297 |
| 5,060,195 A * | 10/1991 | Gill et al. ................ | 365/185.06 |
| 6,222,224 B1 * | 4/2001 | Shigyo ........................ | 257/315 |
| 2004/0087120 A1 * | 5/2004 | Feudel et al. ................ | 438/525 |
| 2006/0049464 A1 | 3/2006 | Rao | |

FOREIGN PATENT DOCUMENTS

WO    8602202    4/1986

* cited by examiner

*Primary Examiner*—Zandra Smith
*Assistant Examiner*—Paul E Patton
(74) *Attorney, Agent, or Firm*—Dicke, Billig & Czaja, PLLC (57) ABSTRACT

A memory cell array of nonvolatile semiconductor memory cells is specified in which a minority carrier sink is formed within a semiconductor body in the region of the memory cell array, the minority carrier sink being arranged outside a space charge zone structure that forms in the semiconductor body during operation of the semiconductor memory cells, and the minority carrier sink having a shorter minority carrier lifetime in comparison with a semiconductor zone reaching as far as a surface of the semiconductor body.

12 Claims, 7 Drawing Sheets

MINORITY CARRIER SINK FOR A MEMORY CELL ARRAY COMPRISING NONVOLATILE SEMICONDUCTOR MEMORY CELLS

BACKGROUND

During the operation of memory cell arrays including nonvolatile memory cells such as twin flash memory cells, for instance, minority carriers arise within a semiconductor zone such as, for instance, a well zone of the memory cells. The lifetime of such minority carriers is, for example in known memory cell arrays composed or crystalline silicon, so long that they can diffuse to an extent of many micrometers before recombination with a majority carrier takes place. During this diffusion, the minority carriers can also reach interface states of a lower oxide layer of an ONO (Oxide-Nitride-Oxide) memory layer of adjacent memory cells, be trapped there or even be injected into the nitride layer given the presence of corresponding electric fields. In this case, the charge state changes within the ONO memory layer of the adjacent memory cells, which entails an undesirable loss of information.

A memory cell array of nonvolatile semiconductor memory cells in which the problem explained above in connection with the diffusion of minority carriers is alleviated or does not occur would be desirable.

SUMMARY

One embodiment relates to a memory cell array of nonvolatile semiconductor memory cells including a semiconductor body having a semiconductor zone of a first conductivity type that reaches as far as a surface of the semiconductor body, and buried bit lines that are formed within the semiconductor zone and serve as source/drain regions. By way of example, the memory cell array additionally has a channel region formed at the surface between in each case two of the buried bit lines, a dielectric layer stack that is formed on the channel region and serves as charge storage zone, and a gate electrode formed on the dielectric layer stack, wherein the gate electrode is electrically connected to a word line. The memory cell array additionally contains a space charge zone structure including those regions within the semiconductor zone in which a space charge zone can form during the operation of the semiconductor memory cells, and at least one minority carrier sink formed within the semiconductor body, wherein that at least one minority carrier sink is arranged outside the space charge zone structure and has a shorter minority carrier lifetime in comparison with the semiconductor zone.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Further embodiments and advantages of embodiments are illustrated on the basis of the following detailed description in conjunction with the accompanying drawings, in which.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment relates to a memory cell array of nonvolatile semiconductor memory cells including a semiconductor body having a semiconductor zone of a first conductivity type that reaches as far as a surface of the semiconductor body, and buried bit lines that are formed within the semiconductor zone and serve as source/drain regions. By way of example, the memory cell array additionally has a channel region formed at the surface between in each case two of the buried bit lines, a dielectric layer stack that is formed on the channel region and serves as charge storage zone, and a gate electrode formed on the dielectric layer stack, wherein the gate electrode is electrically connected to a word line. The memory cell array additionally contains a space charge zone structure including those regions within the semiconductor zone in which a space charge zone can form during the operation of the semiconductor memory cells, and at least one minority carrier sink formed within the semiconductor body, wherein that at least one minority carrier sink is arranged outside the space charge zone structure and has a shorter minority carrier lifetime in comparison with the semiconductor zone.

The semiconductor body may be formed for example from Si, Ge, SiGe, SiC, III-V compound semiconductor such as GaAs or else further semiconductor materials or compound semiconductors. The buried bit lines serving as source/drain regions are formed for instance as doped semiconductor regions and extend within the memory cell array along a sequence of nonvolatile semiconductor memory cells.

The dielectric layer stack has for example dielectric layers stacked one on top of another, wherein at least one of the dielectric layers is chosen in such a way that it serves as a charge storage layer. By way of example, the dielectric layer stack may be an ONO stack in which the nitride layer serves as a charge carrier storage layer. The gate electrode is formed for instance from a conductive material and may include a doped semiconductor material, an intrinsic semiconductor material with sufficient intrinsic conductivity or else a metal. By way of example, the gate electrode is formed from doped polycrystalline silicon. A sequence of semiconductor memory cells is likewise connected to the word line. The word line may be formed for example from the same material as the gate electrode or alternatively from a conductive material that is different from the material of the gate electrode. Like the gate electrode, too, this may involve for example a doped semiconductor material, an intrinsic semiconductor material with sufficient intrinsic conductivity or alternatively a metal. Via selected bit lines and also a word line, it is possible for instance to drive a specific semiconductor memory cell in the memory cell array.

The space charge zone structure includes those regions within the semiconductor zone in which a space charge zone can form under operating conditions. This may involve for example a space charge zone surrounding the bit lines in the case where a voltage drop is present between bit line and semiconductor zone. Possible space charge zone regions that are attributable to a voltage drop between the gate electrode and the semiconductor zone are likewise covered by this. The semiconductor zone may be a doped well zone, for example. The first conductivity type may be a p type, so that a second conductivity type opposite thereto is an n type. It is likewise possible for the first conductivity type to be an n type and the second conductivity type to be formed as a p type.

The minority carrier sink represents a region or a collection of regions within the semiconductor body and has no overlap with the space charge zone structure. This ensures that no additional leakage current is generated within the semiconductor zone.

The minority carrier lifetime within the at least one minority carrier sink is for example at least ten times shorter than within the semiconductor zone. This makes it possible to counteract an undesirable diffusion of minority carriers into adjacent semiconductor memory cells and in particular into the vicinity of charge storage zones therein.

It is favorable if a diffusion length within the at least one minority carrier sink corresponding to the minority carrier lifetime is set such that it is less than a distance between adjacent memory cells. A reduction of the minority carrier lifetime and hence a shortening of the diffusion length of minority carriers can be obtained by increasing the minority carrier recombination within the at least one minority carrier sink. An increased recombination rate can be obtained for example by increasing a crystal defect density and hence introducing recombination centers or else by increasing a dopant concentration within the at least one minority carrier sink in order to increase Auger recombination.

The at least one minority carrier sink has for example at least one deep defect or a deep defect distribution. This makes it possible to obtain an intensified recombination that can be described for example by the Shockley-Read-Hall recombination model.

In accordance with one embodiment, the at least one minority carrier sink has at least one of the elements causing deep defects from the group consisting of Au, Ge, Fe, Ni, Cu, C, Ta, V, Cd and Co. When introducing such metallic impurities into the semiconductor body, however, care must be taken to ensure that a temperature budget that is still to be carried out after the introduction of one or more of the elements during the further process sequence does not lead to such a high degree of outdiffusion of the elements that the electrical properties of the semiconductor memory cells are thereby impaired.

The at least one minority carrier sink may at least partly have an amorphous construction. The amorphous construction leads to a deep defect distribution within an energy band gap of the semiconductor body and thus to the desired intensification of the recombination. It is conceivable to recrystallize the semiconductor zone from the surface as far as a specific depth into the semiconductor body, e.g., by using laser crystallization, an amorphous region that remains below the recrystallized region serving as minority carrier sink.

It is likewise possible for dislocations having a density of at least $10^{11}$ cm$^{-2}$ to be formed within the at least one minority carrier sink. An intensified recombination occurs at dislocations and a reduction of the minority carrier lifetime can be obtained with dislocation densities above $10^{11}$ cm$^{-2}$.

In a further embodiment, the at least one minority carrier sink has a maximum dopant concentration of more than $10^{17}$ cm$^{-3}$. Such high dopant concentrations lead for instance to an intensified Auger recombination in silicon. The Auger recombination mechanism can thus be utilized by way of the dopant concentration for setting the minority carrier lifetime. The at least one minority carrier sink may be formed for example as a well zone implanted deeply into the semiconductor body.

The at least one minority carrier sink may be embedded within the semiconductor zone.

In accordance with a further embodiment, a memory cell array including nonvolatile semiconductor memory cells is specified including a semiconductor body having a semiconductor zone of a first conductivity type that reaches as far as a surface of the semiconductor body, and buried bit lines that are formed within the semiconductor zone and serve as source/drain regions. By way of example, the memory cell array additionally has a channel region formed at the surface between in each case two of the buried bit lines, a dielectric layer stack that is formed on the channel region and serves as charge storage zone, and a gate electrode formed on the dielectric layer stack, wherein the gate electrode is electrically connected to a word line. The memory cell array additionally contains a space charge zone structure including those regions within the semiconductor zone in which a space charge zone can form during the operation of the semiconductor memory cells, and at least one minority carrier sink—formed within the semiconductor body—of a second conductivity type, which is opposite to the first conductivity type, wherein the at least one minority carrier sink is arranged outside the space charge zone structure and is short-circuited with the semiconductor zone.

Consequently, it is possible to extract the minority carriers as in the case of a solar cell in the short circuit by using an electric field incorporated between the at least one minority carrier sink and the semiconductor zone.

In a further embodiment, the at least one minority carrier sink and the semiconductor zone are short-circuited via an electrical connection outside the semiconductor body. By way of example, the semiconductor zone and also the at least one minority carrier sink can be contact-connected via the surface, e.g., be connected with a conductive contact plug and to a common metal level and thus be short-circuited. The at least one minority carrier sink within the semiconductor body can be routed to the surface for example via a further semiconductor zone of the same conductivity type, e.g., via a buried layer. It is likewise possible for the at least one minority carrier sink to be routed to the surface for example via a trench with conductive filling material.

It is also possible for the at least one minority carrier sink and the semiconductor zone to be short-circuited within the semiconductor body. Such a short circuit between these two zones may be provided for example via a silicide within the semiconductor body. A short circuit can be realized for instance by charge carrier tunneling given a correspondingly high dopant concentration in a transition region provided for this.

The at least one minority carrier sink and the semiconductor zone may be connected to a lower supply voltage. The lower supply voltage may be for example a ground (GND) potential.

In accordance with a further embodiment, a memory cell array of nonvolatile semiconductor memory cells is specified including a semiconductor body having a semiconductor zone of a first conductivity type that reaches as far as a surface of the semiconductor body, and buried bit lines that are formed within the semiconductor zone and serve as source/drain regions. By way of example, the memory cell array additionally has a channel region formed at the surface between in each case two of the buried bit lines, a dielectric layer stack that is formed on the channel region and serves as charge storage zone, and a gate electrode formed on the dielectric layer stack, wherein the gate electrode is electrically connected to a word line. The memory cell array additionally contains a space charge zone structure including those regions within the semiconductor zone in which a space charge zone can form during the operation of the semiconductor memory cells, and at least one minority carrier sink—formed within the semiconductor body—of a second conductivity type, which is opposite to the first conductivity type, wherein the at least one minority carrier sink is arranged in floating fashion outside the space charge zone structure. Consequently, the at least one minority carrier sink is not connected to a defined potential, i.e. it is potential-free. By way of example, the at least one minority carrier sink may be entirely surrounded by a semiconductor zone of the opposite first conductivity type.

The at least one minority carrier sink is embedded for instance within the semiconductor zone. Such embedding can be obtained for example by using a deep implantation in order to form the sink.

In accordance with a further embodiment, a memory cell array of nonvolatile semiconductor memory cells is specified including a semiconductor body having a semiconductor zone of a first conductivity type reaching as far as a surface of the semiconductor body, and buried bit lines that are formed within the semiconductor zone and serve as source/drain regions. By way of example, the memory cell array additionally has a channel region formed at the surface between in each case two of the buried bit lines, a dielectric layer stack that is formed on the channel region and serves as charge storage zone, and a gate electrode formed on the dielectric layer stack, wherein the gate electrode is electrically connected to a word line. The memory cell array additionally contains a space charge zone structure including those regions within the semiconductor zone in which a space charge zone can form during the operation of the semiconductor memory cells, and at least one minority carrier sink—formed within the semiconductor body—of a second conductivity type, which is opposite to the first conductivity type, wherein the at least one minority carrier sink is arranged outside the space charge zone structure and the semiconductor zone is connected to a voltage which lies, relative to the at least one minority carrier sink, within the range of −2 V to 0 V or 0 V to 2 V if the semiconductor zone is of the p conductivity type or n conductivity type, respectively. Consequently, the semiconductor zone is reverse-biased relative to the at least one minority carrier sink. While this on the one hand slightly increases a secondary generation of minority carriers, on the other hand a more effective extraction of the minority carriers can be obtained on account of the further space charge zone structure extending toward the surface proceeding from the at least one minority carrier sink.

In a further embodiment, the voltage between the semiconductor zone and the at least one minority carrier sink can be regulated. An extraction of the minority carriers can thus be obtained depending on the operating state of the memory cell array.

In this case, the at least one minority carrier sink is connected for instance to a lower supply voltage.

The nonvolatile semiconductor memory cells may be twin flash memory cells, for example.

In accordance with a further embodiment, the at least one minority carrier sink is formed as a plurality of individual minority carrier sinks arranged with regular spacing. The distance between the adjacent individual minority carrier sinks may be chosen for example such that it matches the distance between adjacent semiconductor memory cells. It is possible that the individual minority carrier sinks can be formed without a lithography mask specially provided therefor. By way of example, the individual minority carrier sinks could be formed by using an implantation process with the aid of a source/drain mask that is inherently present in the process. It goes without saying that, for forming the individual minority carrier sinks, it is likewise possible to use further suitable masks. Consequently, the individual minority carrier sinks may be formed congruently with respect to further semiconductor zones within the semiconductor body.

A further embodiment relates to an electronic apparatus including an interface and also a memory device that can be connected to the interface, wherein the memory device includes a memory cell array in accordance with one of the embodiments explained above.

Figure 1A:
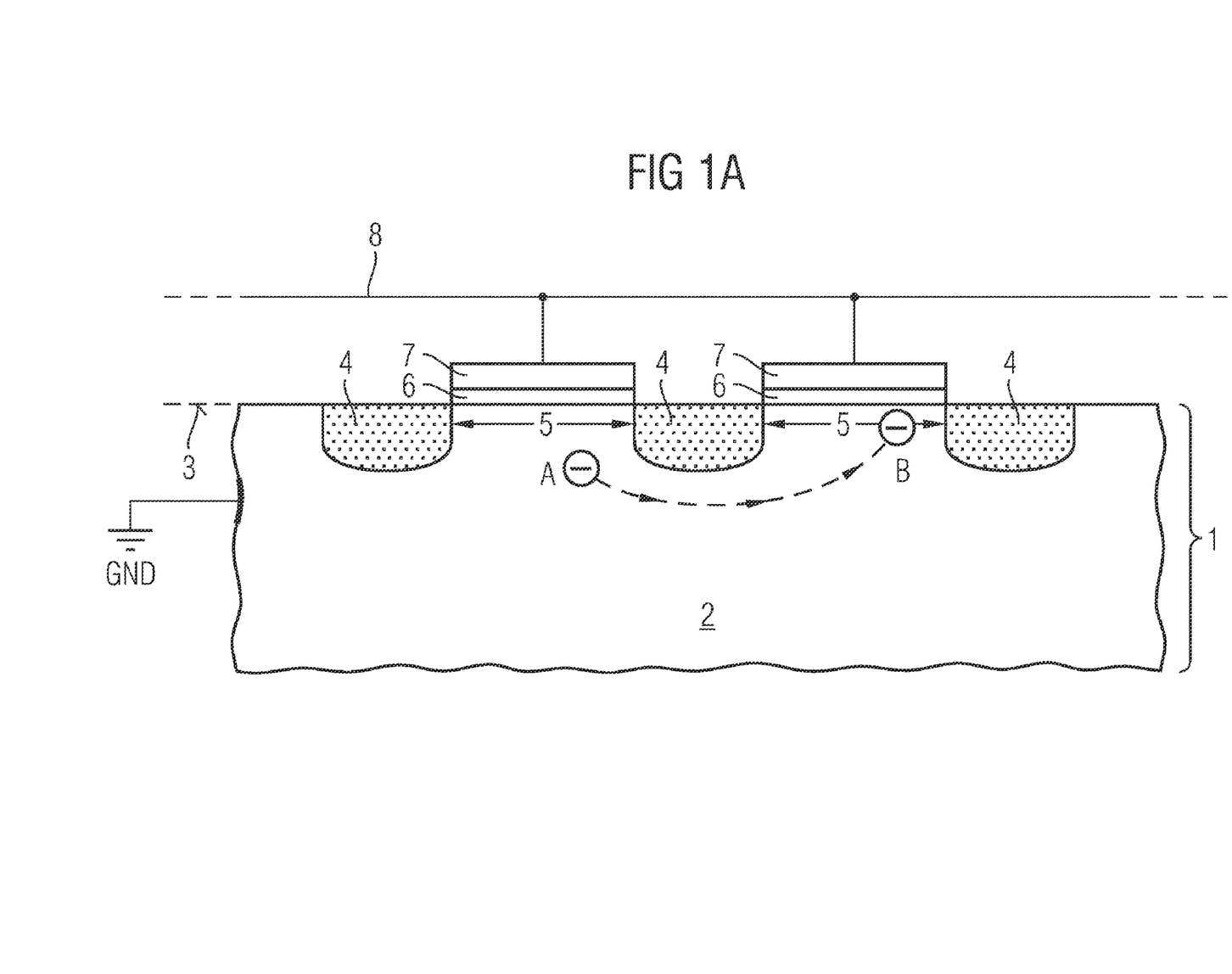
FIGS. 1A and B illustrate a schematic cross-sectional view and also a schematic plan view of an excerpt from a memory cell array of known nonvolatile semiconductor memory cells.

FIG. 1A illustrates a schematic cross-sectional view of an excerpt from a memory cell array of known nonvolatile semiconductor memory cells. Within a semiconductor body 1, a semiconductor zone 2 is formed as far as a surface 3 of the semiconductor body 1. Bit lines 4 that are adjacent to one another and serve as source/drain regions are formed within the semiconductor zone 2. A channel region 5 lies between adjacent bit lines 4. A dielectric layer stack 6 is represented in a simplified manner on the channel region 5. The dielectric layer stack 6 may be formed for example as an ONO (Oxide-Nitride-Oxide) layer sequence and serves as charge storage zone. A gate electrode 7 lies on the dielectric layer stack 6, the gate electrode being connected to a word line 8 represented in a simplified manner. The word line 8 is connected to a plurality of gate electrodes 7 of a sequence of successively arranged memory cells. In this case, a memory cell is formed for example by using two adjacent bit lines 4 as respective source and drain region and also the intervening channel region 5, the dielectric layer structure 6 and the gate electrode 7. As can be gathered from the excerpt from the memory cell array that is illustrated in FIG. 1A, for instance the middle one of the three bit lines 4 illustrated serves as common source/drain region of an adjoining semiconductor memory cell on the left and right with respect to the bit line 4. The semiconductor zone 2 is connected to a lower supply voltage GND in a manner represented in a simplified manner. Such a connection may be provided for example by using a dummy word line that makes contact with the semiconductor zone 2 via the surface 3. It shall be assumed that a minority carrier (identified as "-" in a simplified manner) was generated at the location A. The minority carrier can then diffuse to an adjacent memory cell to the schematically identified location B, where, given the presence of electric fields, it can also pass into a charge storage layer of the dielectric layer stack 6. This can change the storage state of the corresponding memory cell.

Figure 1B:
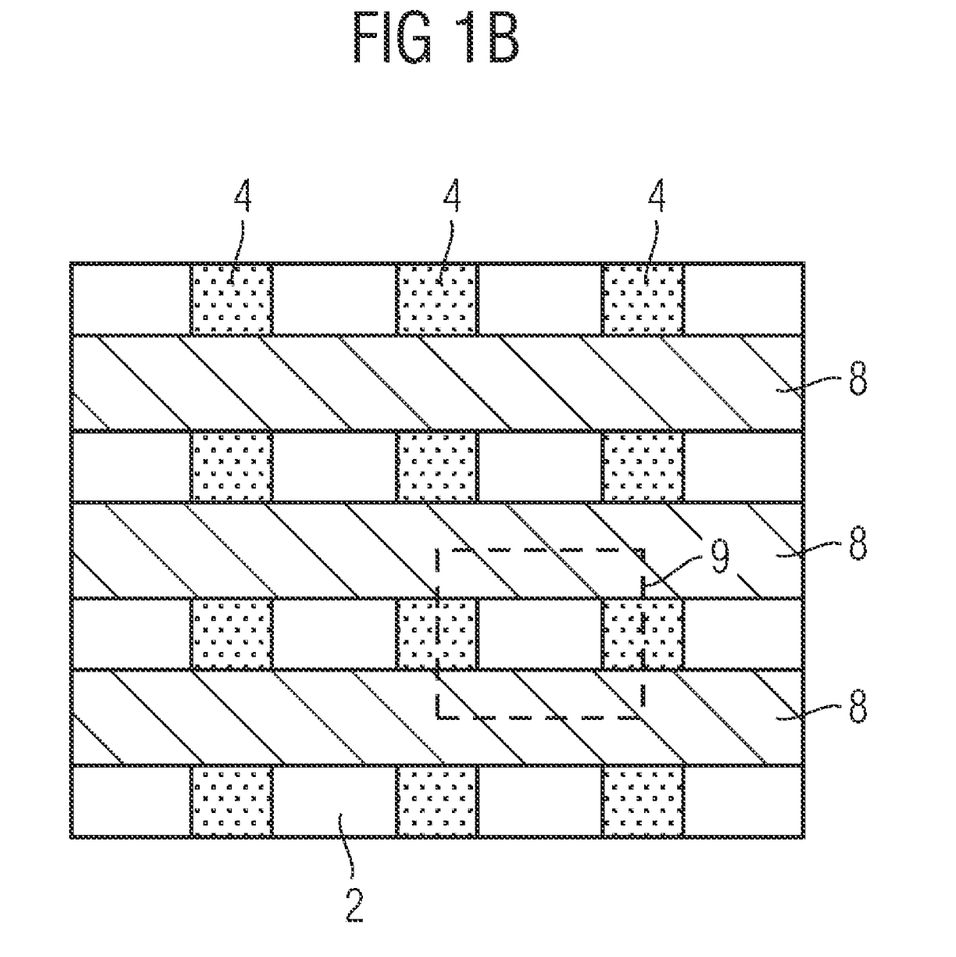

FIG. 1B illustrates a schematic plan view of the memory cell array illustrated as a cross section in FIG. 1A. In this case, the bit lines 4 run perpendicular to the word lines 8, the dimensions of an individual memory cell 9 being identified schematically. The individual memory cell 9 can thus be driven via an assigned word line 8 and via two assigned bit lines 4.

Figure 2:
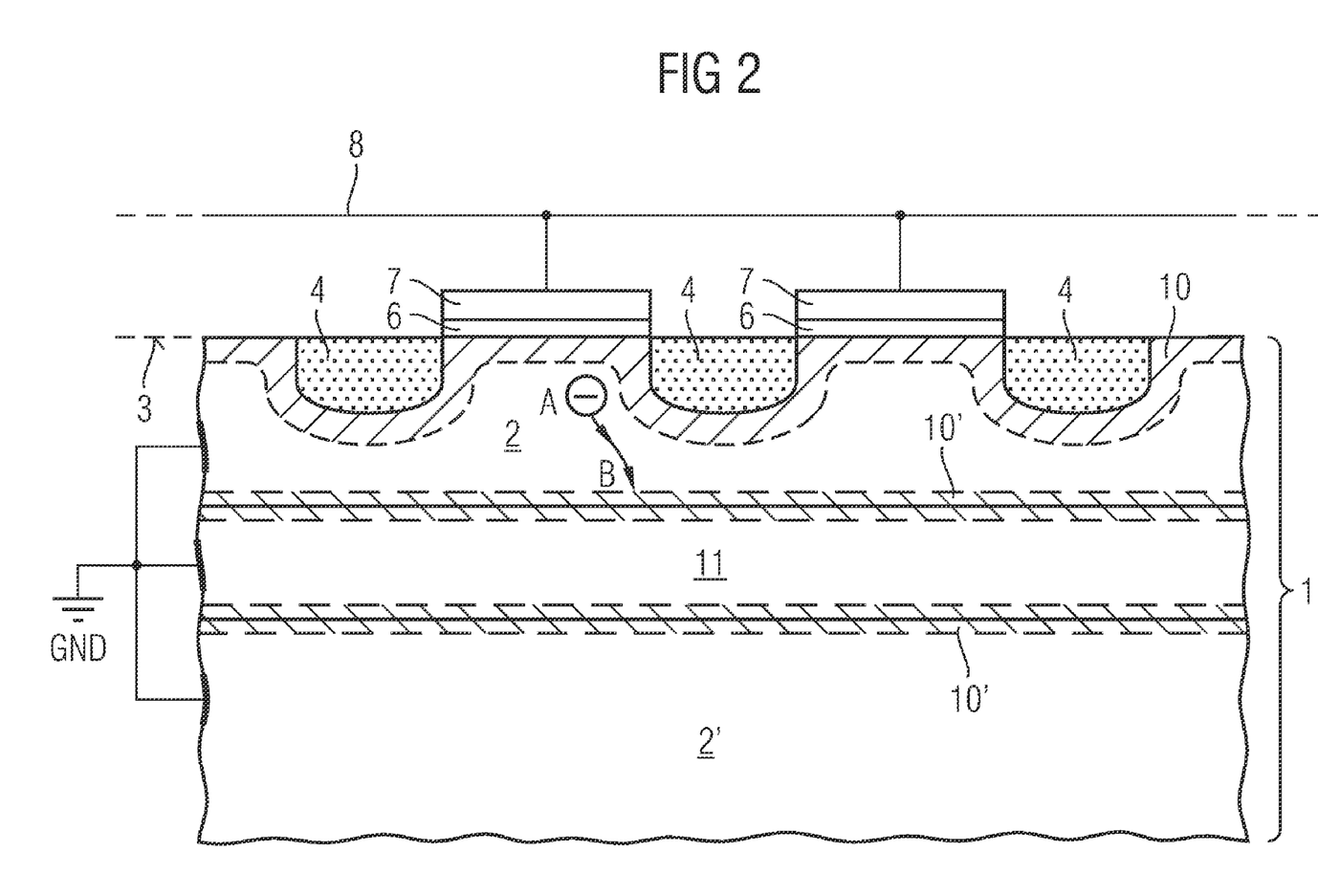
FIG. 2 illustrates a schematic cross-sectional view of an excerpt from a memory cell array of nonvolatile semiconductor memory cells in accordance with one embodiment.

FIG. 2 illustrates a schematic cross-sectional view of an excerpt from a memory cell array of nonvolatile semiconductor memory cells in accordance with one embodiment.

Components matching those of the known memory cell array in FIG. 1A are identified by the same reference symbols in FIG. 2 and also in the further figures, and a renewed description thereof is dispensed with. In this case, reference should be made to the description concerning FIG. 1A.

The memory cell array has a space charge zone structure 10, denoting those regions within the semiconductor zone 2 in which a space charge zone can form during the operation of the semiconductor memory cells. A minority carrier sink 11 is formed in a manner located outside the space charge zone structure 10 and deeper within the semiconductor body 1. The minority carrier sink 11 has a conductivity type opposite to the conductivity type of the semiconductor zone 2. By way of example, the semiconductor zone 2 may be of the p type and the minority carrier sink 11 may be of the n type. The minority carrier sink 11 downwardly adjoins a further semiconductor zone 2'. The further semiconductor zone 2' is of the same conductivity type as the semiconductor zone 2. By way of example, the semiconductor zone 2 and the further semiconductor zone 2' may be formed as a common well zone, such that the minority carrier sink 11 is embedded therein. Such embedding of the minority carrier sink 11 can be obtained for example by using a deep implantation. The semiconductor zone 2, the minority carrier sink 11 and also the further semiconductor zone 2' are short-circuited and connected to a lower supply potential GND. A short-circuiting of the zones 2, 11, 2' that is illustrated in a simplified manner in FIG. 2 may be effected for example within the semiconductor body 1. Likewise, the zones 2, 11, 2' can also be short-circuited outside the semiconductor body 1, e.g., by using a metal level and contact plugs. In the transition region between the minority carrier sink 11 and the semiconductor zone 2 and also the minority carrier sink 11 and the further semiconductor zone 2', a further space charge zone structure 10' with an incorporated electric field is formed despite the short-circuited regions. A minority carrier generated at the location A can thus be extracted at the location B by using the incorporated electric field of the further space charge zone structure 10'. It is thereby possible to counteract a diffusion of the minority charge carriers to adjacent memory cells.

Figure 3:
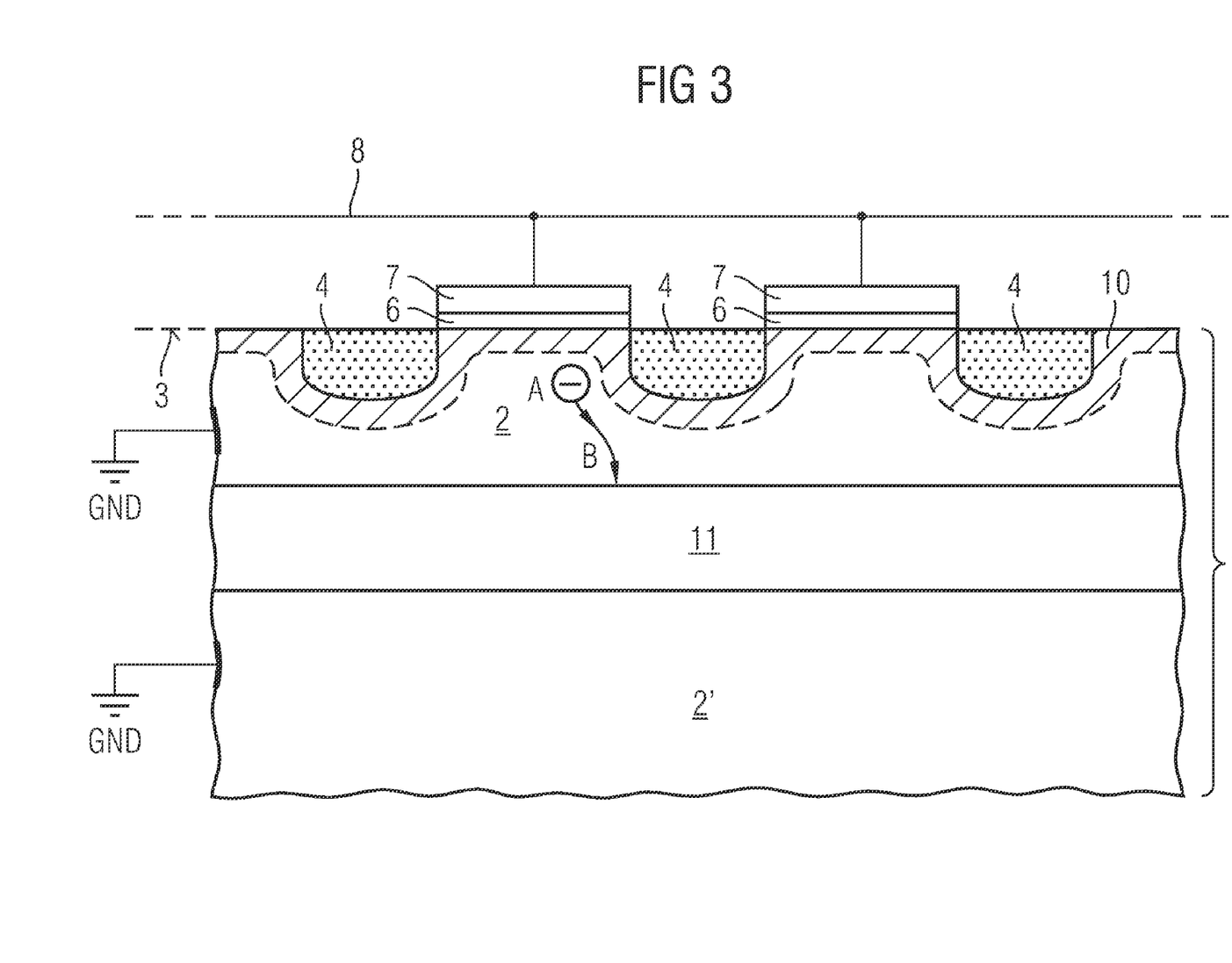
FIG. 3 illustrates a schematic cross-sectional view of an excerpt from a memory cell array of nonvolatile semiconductor memory cells in accordance with a further embodiment of the invention.

FIG. 3 illustrates a schematic cross-sectional view of an excerpt from a memory cell array of nonvolatile semiconductor memory cells in accordance with a further embodiment. In contrast to the embodiment illustrated in FIG. 2, the minority carrier sink 11 may be formed in floating fashion, i.e. in potential-free fashion. Likewise, the minority carrier sink 11 may be formed for example as a zone with recombination centers. In this case, it is not necessary for the minority carrier sink to have a different conductivity type from the semiconductor zones 2, 2', which is provided, however, in the former case of the floating minority carrier sink 11. A reduction of the minority carrier lifetime can be obtained by intensified recombination at recombination centers within the minority carrier sink, e.g., by using lifetime killers, such as Au, or crystal defects such as dislocations, for instance. As already explained in connection with the first embodiment in FIG. 2, lowering the minority carrier lifetime makes it more difficult, for example, for a minority carrier generated at the location A to diffuse to an adjacent memory cell, since the minority carrier can be extracted from the minority carrier sink 11 at the location B.

Figure 4:
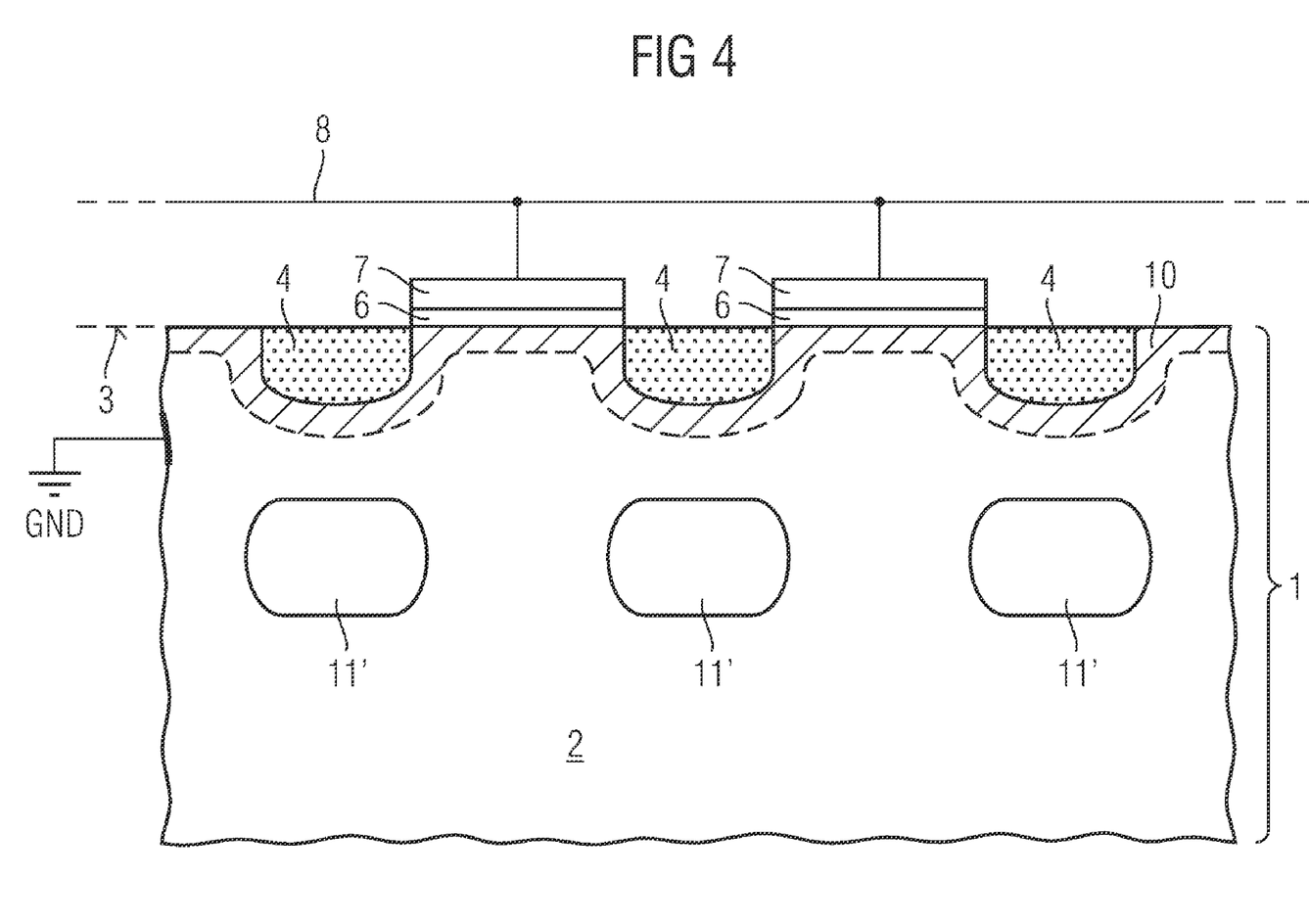
FIG. 4 illustrates a schematic cross-sectional view of an excerpt from a memory cell array of nonvolatile semiconductor memory cells in accordance with a further embodiment of the invention.

FIG. 4 illustrates a schematic cross-sectional view of an excerpt from a memory cell array of nonvolatile semiconductor memory cells in accordance with a further embodiment of the invention. In contrast to the embodiments illustrated in FIGS. 2 and 3, this embodiment has individual minority carrier sinks 11' embedded within the semiconductor zone 2. In this case, the semiconductor zone 2 is connected to the lower supply voltage GND. The individual minority carrier sinks 11' are arranged at regular distances from one another. The positioning of the individual minority carrier sinks 11' is congruent with the arrangement of the bit lines 4. By way of example, a mask provided for the bit lines 4 is used for forming them. The individual minority carrier sinks 11 have for example an increased concentration of recombination centers in comparison with the semiconductor zone 2. The recombination centers may be formed for instance by lifetime killers such as Au or else by crystal defects such as dislocations, for instance. It is likewise conceivable to form the individual minority carrier sinks as floating semiconductor regions of an opposite conductivity type in comparison with the semiconductor zone 2.

Figure 5:
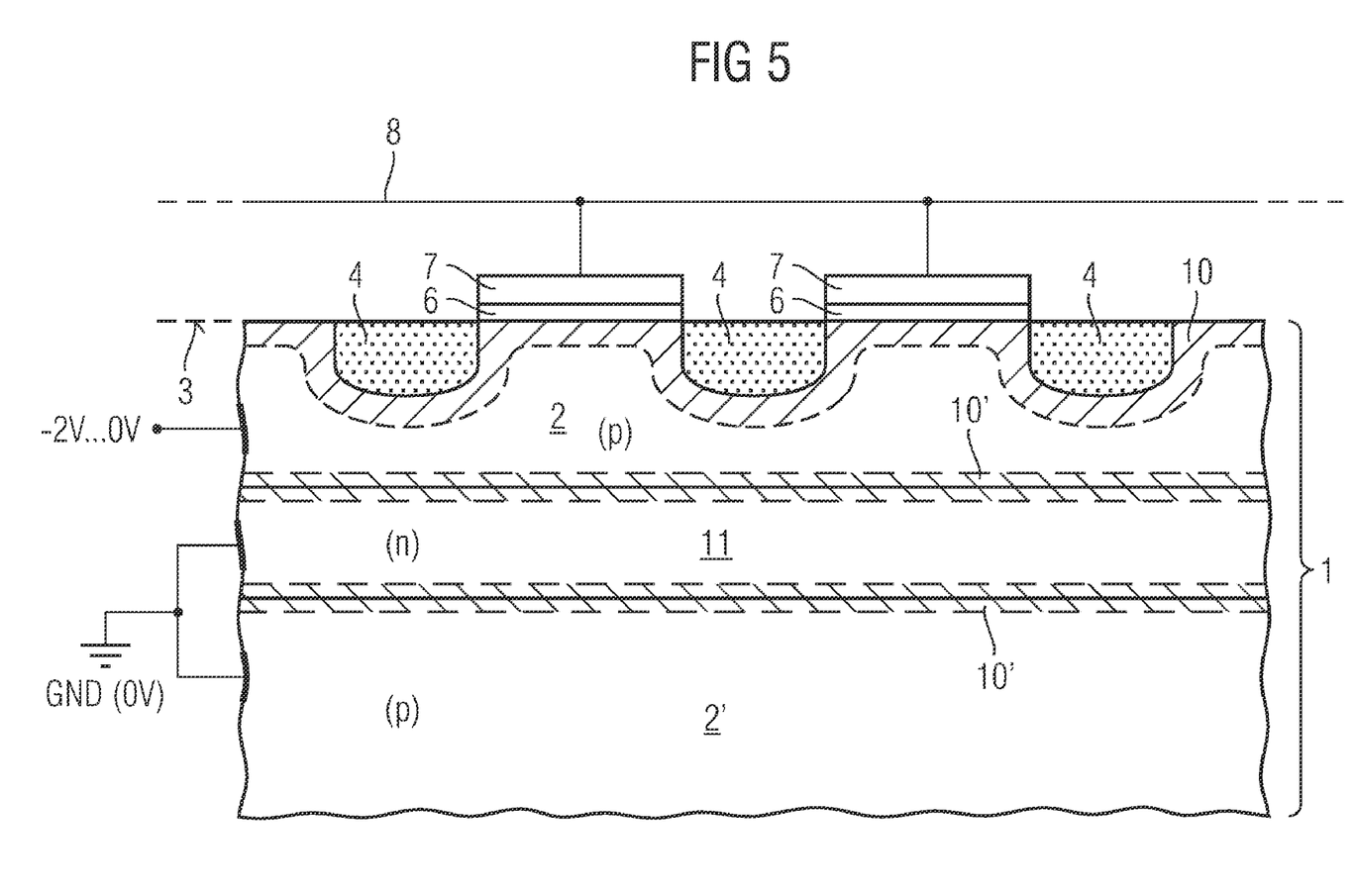
FIG. 5 illustrates a schematic cross-sectional view of an excerpt from a memory cell array of nonvolatile semiconductor memory cells in accordance with a further embodiment of the invention.

FIG. 5 illustrates a schematic cross-sectional view of an excerpt from a memory cell array of nonvolatile semiconductor memory cells in accordance with a further embodiment. In contrast to the embodiment illustrated in FIG. 2, the semiconductor zone 2 has a potential within the range of −2 V to 0 V. It shall be assumed that the semiconductor zone 2 and also the further semiconductor zone 2' are of the p conductivity type. The minority carrier sink shall be of the n conductivity type. Consequently, a pn junction between the semiconductor zone 2 and the minority carrier sink 11 is reverse-biased, for which reason the further semiconductor zone structure 10' extends upward into the semiconductor zone 2 and better extraction of minority carriers becomes possible. Restricting the bias voltage of the semiconductor zone 2 to voltages up to −2 V makes it possible to keep generation of secondary minority carriers at a level that is not harmful for the operation of the memory cells.

Figure 6:
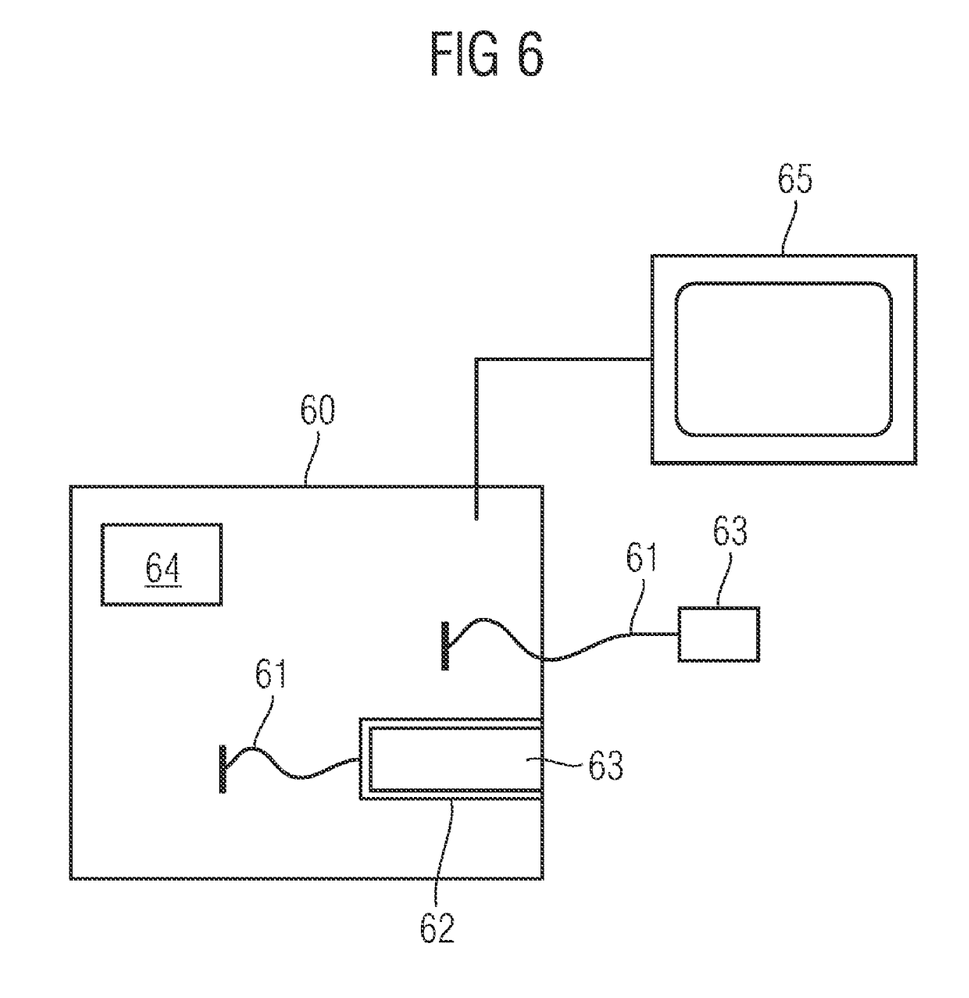
FIG. 6 schematically illustrates an electronic apparatus in accordance with one embodiment.

FIG. 6 schematically illustrates an electronic apparatus 60 in accordance with one embodiment. As is illustrated in FIG. 6, the electronic apparatus 60 has an interface 61 and a memory device 63 that can be linked to the interface 61. The memory device 63 contains a memory cell array as described above. By way of example, the memory device 63 can be connected to the interface 61. As seems evident to a person skilled in the art, however, any other type of interface can be implemented between the electronic apparatus 60 and the memory device 63. By way of example, the electronic apparatus 60 may contain a slot 62 into which the memory device 63 can be inserted and electrically connected to an interface 61. The electronic apparatus 60 may additionally contain a processing device 64 for processing data. In addition, the electronic apparatus 60 may contain a display 65 for displaying data. The electronic apparatus may additionally have components that serve for implementing an electronic system. Examples of the electronic system include a computer, e.g., personal computer or a notebook, a server, a router, a games console, e.g., a video game console and as a further example a portable video game console, a graphics card, a personal digital assistant, a digital camera, a mobile telephone, an audio system such as any type of music player, or a video system. However, it appears obvious to a person skilled in the art that the electronic system can be embodied by any further type of device, wherein the device can process or transmit or store digital data.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell array of nonvolatile semiconductor memory cells comprising:
    a semiconductor body having a semiconductor zone of a first conductivity type that reaches as far as a surface of the semiconductor body;
    buried bit lines that are formed within the semiconductor zone and serve as source/drain regions;
    a space charge zone structure comprising those regions within the semiconductor zone in which a space charge zone can form during the operation of the semiconductor memory cells; and
    at least one minority carrier sink—formed within the semiconductor body—of a second conductivity type, which is opposite to the first conductivity type, wherein the at least one minority carrier sink is arranged outside the space charge zone structure and is short-circuited with the semiconductor zone.

2. The memory cell array of claim 1, wherein a diffusion length within the minority carrier sink corresponding to a minority carrier lifetime is set such that it is less than a distance between adjacent memory cells.

3. The memory cell array of claim 1, wherein one minority carrier sink has at least one deep defect or a deep defect distribution.

4. The memory cell array of claim 3, wherein one minority carrier sink has at least one of the elements causing deep defects from the group consisting of Au, Ge, Fe, Ni, Cu, C, Ta, V, Cd and Co.

5. The memory cell array of claim 1, wherein one minority carrier sink at least partly has an amorphous construction.

6. The memory cell array of claim 1, wherein dislocations having a density of at least $10^{11}$ cm$^{-2}$ are formed within one minority carrier sink.

7. The memory cell array of claim 1, wherein one minority carrier sink has a maximum dopant concentration of greater than $10^{17}$ cm$^{-3}$.

8. The memory cell array of claim 1, wherein a minority carrier lifetime within one minority carrier sink is at least ten times shorter than within the semiconductor zone.

9. The memory cell array of claim 1, wherein one minority carrier sink and the semiconductor zone are short-circuited via an electrical connection outside the semiconductor body.

10. The memory cell array of claim 1, wherein one minority carrier sink and the semiconductor zone are short-circuited within the semiconductor body.

11. The memory cell array of claim 1, wherein one minority carrier sink and the semiconductor zone are connected to a lower supply voltage.

12. A memory cell array of nonvolatile semiconductor memory cells comprising:
    a semiconductor body having a semiconductor zone of a first conductivity type that reaches as far as a surface of the semiconductor body;
    buried bit lines that are formed within the semiconductor zone and serve as source/drain regions;
    a channel region formed at the surface between in each case two of the buried bit lines;
    a dielectric layer stack that is formed on the channel region and serves as charge storage zone;
    a gate electrode formed on the dielectric layer stack, wherein the gate electrode is electrically connected to a word line;
    a space charge zone structure comprising those regions within the semiconductor zone in which a space charge zone can form during the operation of the semiconductor memory cells; and
    at least one minority carrier sink—formed within the semiconductor body—of a second conductivity type, which is opposite to the first conductivity type, wherein the at least one minority carrier sink is arranged outside the space charge zone structure and is short-circuited with the semiconductor zone.

* * * * *